United States Patent
Hong et al.

(10) Patent No.: US 7,479,830 B2
(45) Date of Patent: Jan. 20, 2009

(54) DIFFERENTIAL AMPLIFIER USING BODY-SOURCE CROSS COUPLING

(75) Inventors: Songcheol Hong, Daejeon (KR); Dong Ho Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 61 days.

(21) Appl. No.: 11/648,692

(22) Filed: Jan. 3, 2007

(65) Prior Publication Data

US 2008/0088373 A1   Apr. 17, 2008

(30) Foreign Application Priority Data

Oct. 16, 2006   (KR) ............... 10-2006-0100409

(51) Int. Cl.
*H03F 3/45* (2006.01)
*H03F 1/22* (2006.01)

(52) U.S. Cl. ............... 330/253; 330/307; 330/311

(58) Field of Classification Search ............... 330/307, 330/311

See application file for complete search history.

(56) References Cited

U.S. PATENT DOCUMENTS

| 4,423,387 A  * | 12/1983 | Sempel ............... 330/85 |
| 6,724,258 B1 | 4/2004 | Fayed |
| 7,019,591 B2 | 3/2006 | Gupta |

* cited by examiner

*Primary Examiner*—Steven J Mottola
(74) *Attorney, Agent, or Firm*—Oliff & Berridge, PLC

(57) ABSTRACT

Disclosed herein is a differential amplifier using body-source cross coupling. In a common gate differential amplifier in which common gate amplifiers are implemented in a differential structure, since the bodies of the common gate amplifiers are cross coupled to the sources of the opposite common gate amplifiers, it is possible to increase transconductance due to body effect to improve a gain. Since the potential of the body is equal to that of the source in a DC mode, a breakdown voltage reduction problem is alleviated.

9 Claims, 8 Drawing Sheets

DIFFERENTIAL AMPLIFIER USING BODY-SOURCE CROSS COUPLING

BACKGROUND OF THE INVENTION

1. Field of the Invention

The present invention relates to a differential amplifier using body-source cross coupling, and more particularly, to a differential amplifier using body-source cross coupling, which is capable of increasing transconductance due to body effect to increase a gain and suppressing a breakdown voltage from being reduced, by cross coupling bodies and sources of common gate amplifiers in a common gate differential amplifier in which the common gate amplifiers are implemented in a differential structure.

2. Description of the Related Art

FIGS. 1 and 2 are circuit diagrams showing a conventional common gate differential amplifier using NMOSFETs and PMOSFETs, respectively.

As shown, in a differential structure, common gates 9 and 29 form virtual grounds and a DC voltage is applied to the gates to form a bias circuit. Current sources 3, 4, 23 and 24 are provided to source terminals 5, 6, 25 and 26 of MOSFETs so as to maintain high impedance while operating current flows. Loads 10, 11, 30 and 31 are provided to drain terminals 7, 8, 27 and 28 of the MOSFETs. The bodies of the MOSFETs are tied to the source of the respective MOSFETs to remove body effect. Differential signals are input to the source terminals 5, 6, 25 and 26 of the MOSFETs, which are differential input terminals, and amplified differential signals are output from the drain terminals 7, 8, 27 and 28 of the MOSFETs, which are differential output terminals.

FIG. 3 is a circuit diagram showing a conventional cascode differential amplifier using NMOSFETs. DC voltages are applied to gates 305 and 306 of common source amplifiers 303 and 304 and a common gate 309 of common gate amplifiers 301 and 302 to form a bias circuit. The common gate of the common gate amplifier is differentially operated in a virtual ground state. The bodies and the sources of the common source amplifiers 303 and 304 and the common gate amplifiers 301 and 302 are respectively tied so as to remove body effect. Differential signals are input to the gates 305 and 306 of the common source amplifiers 303 and 304, which are differential input terminals, and amplified differential signals are output from the drain terminals 307 and 308 of the common gate amplifiers 301 and 302, which are differential output terminals.

In such a differential amplifier, the body effect improves a gain of the common gate amplifier, but reduces a breakdown voltage of the transistor, because the potential of the body is lower than that of the source.

SUMMARY OF THE INVENTION

Therefore, the present invention has been made in view of the above problems, and it is an object of the present invention to provide a differential amplifier using body-source cross coupling, which is capable of increasing transconductance due to body effect to increase a gain and alleviating breakdown voltage reduction, by cross coupling bodies and sources of common gate amplifiers in a common gate differential amplifier in which the common gate amplifiers are implemented in a differential structure.

In accordance with an aspect of the present invention, the above and other objects can be accomplished by the provision of a differential amplifier using body-source cross coupling, in which the differential amplifier is comprised of common gate amplifiers in a differential structure, wherein the bodies of the common gate amplifiers are cross coupled to the sources of the opposite common gate amplifiers.

Preferably, at least one differential amplifier using body-source cross coupling may be combined with one or more common gate differential amplifiers in cascade in plural stages under one voltage source.

Preferably, NMOSFETs for configuring the differential amplifier may be formed in a triple well structure and PMOSFETS may be formed in a twin well structure or the triple well structure.

In accordance with another aspect of the present invention, there is provided a cascode differential amplifier comprising a common source differential amplifier and a common gate differential amplifier, wherein the bodies of the common gate amplifiers are cross coupled to the sources of the opposite common gate amplifiers.

Preferably, one cascode differential amplifier using body-source cross coupling may be inserted under one voltage source and at least one common gate differential amplifier may be inserted between the cascade differential amplifier and a load in cascade in plural stages.

At this time, the bodies of a part or all of the common gate amplifiers are cross coupled to sources of the opposite common gate amplifiers.

Preferably, NMOSFETs for configuring the differential amplifier may be formed in a triple well structure and PMOSFETS may be formed in a twin well structure or the triple well structure.

According to the present invention, since the bodies of the common gate amplifiers are cross coupled to the sources of the opposite common gate amplifiers, it is possible to improve a gain of the common gate differential amplifier due to body effect in an AC mode and to alleviate breakdown voltage reduction in a DC mode, because the potential of the body is equal to that of the source.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The present invention will now be described more fully with reference to the accompanying drawings, in which exemplary embodiments of the invention are shown. It is to be understood that the following embodiments are disclosed for illustrative purposes only. The present invention may be embodied in many different forms and should not be construed as being limited to the embodiments set forth herein.

Figure 4:
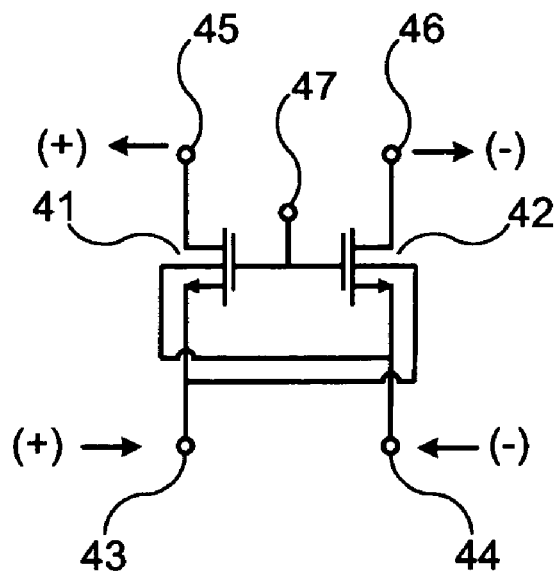
FIG. 4 is a circuit diagram showing an NMOS common gate differential amplifier using body-source cross-coupling according to the present invention.
Figure 5:
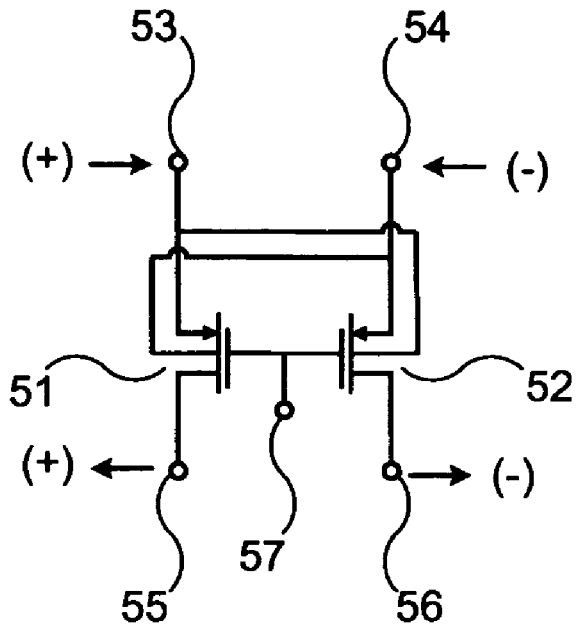
FIG. 5 is a circuit diagram showing a PMOS common gate differential amplifier using body-source cross-coupling according to the present invention.

FIGS. 4 and 5 are circuit diagrams showing differential amplifiers using body-source cross coupling according to the present invention, in which NMOSFETs and PMOSFETs are used, respectively.

As shown, the bodies of the common gate amplifiers are cross coupled to sources of the opposite common gate amplifiers.

In such a differential structure, common gates 47 and 57 form virtual grounds and a DC bias is applied to the gates to form a bias circuit. Source terminals 43, 44, 53 and 54 of the NMOSFETs and the PMOSFETs are provided with current sources 103 and 104 as shown in FIG. 6, inductors 123 and 124 as shown in FIG. 7, or resistors 143 and 144 as shown in FIG. 8 so as to maintain high impedance while operating current flows.

Figure 6:
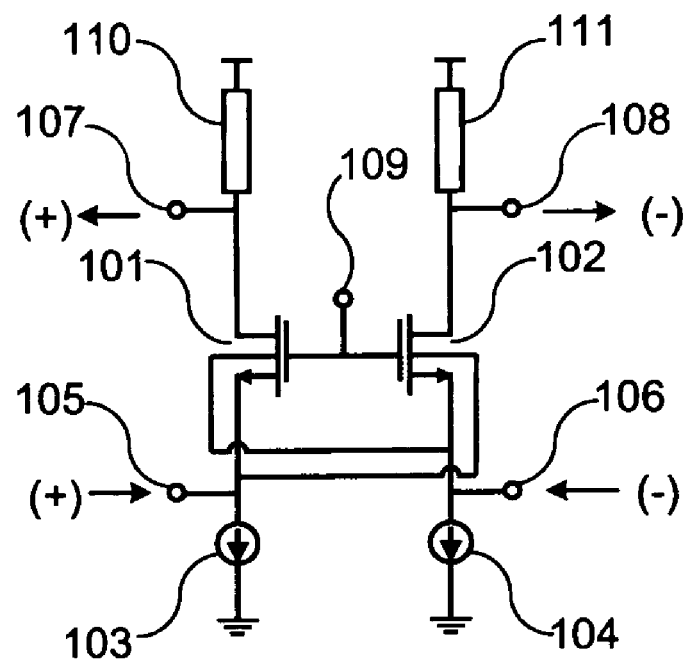
FIG. 6 is a circuit diagram showing a common gate differential amplifier using body-source cross coupling according to the present invention, in which current sources are provided to sources of the amplifiers and loads are provided to drains of the amplifiers.
Figure 7:
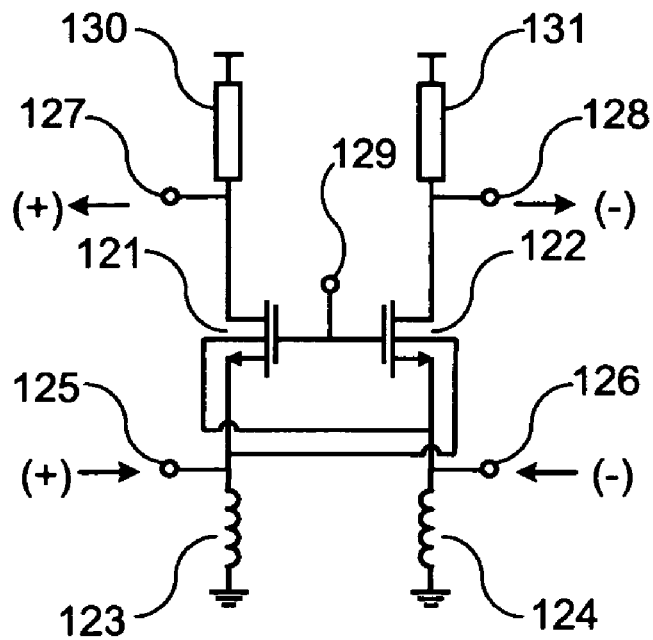
FIG. 7 is a circuit diagram showing a common gate differential amplifier using body-source cross coupling according to the present invention, in which inductors are provided to sources of the amplifiers and loads are provided to drains of the amplifiers.
Figure 8:
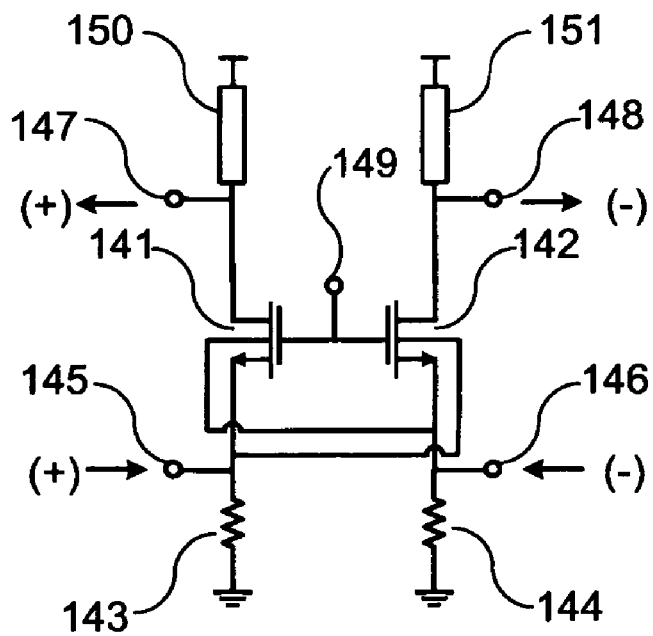
FIG. 8 is a circuit diagram showing a common gate differential amplifier using body-source cross coupling according to the present invention, in which resistors are provided to sources of the amplifiers and loads are provided to drains of the amplifiers.

Drain terminals 45, 46, 55 and 56 of the NMOSFETs and the PMOSFETs are provided with loads 110, 111, 130, 131, 150 and 151, as shown in FIGS. 6, 7 and 8.

Differential signals are input to the sources 43, 44, 53 and 54 of the differential amplifiers, which are differential input terminals, and amplified differential signals are output from the drains 45, 46, 55 and 56 of the differential amplifiers, which are differential output terminals. At this time, when the MOSFETs 41, 42, 51 and 52 are the NMOSFETs, the bodies of the MOSFETs 41, 42, 51 and 52 are formed by a triple well process shown in FIG. 11, and, when the MOSFETs 41, 42, 51 and 52 are the PMOSFETs, the bodies of MOSFETs 41, 42, 51 and 52 are formed by a twin well process or the triple well process such that the bodies are electrically separated.

The differential amplifier using body-source cross coupling has a structure in which the common gate is grounded, the sources function as input terminals, and the drains function as output terminals. Accordingly, in a case of the NMOSFET, when the DC potential of the body is lower than that of the source, transconductance $g_{mb}$ due to the body effect of the common gate amplifier is added to original transconductance $g_m$ to increase a voltage gain. When the potential of the body decreases in the MOSFET structure, a potential difference between the body and the drain increases and thus a breakdown voltage is reduced. The increased voltage gain is expressed by the following Equation.

$$A_v = (g_m + g_{mb}) R_{LOAD}$$

where, $A_v$ is a voltage gain and $R_{LOAD}$ is load resistance.

However, when the common gate amplifiers are configured in a differential structure, the bodies and the sources are cross coupled, and the differential structure is symmetrical, the potentials of the body and the source of each MOSFET become equal in a DC mode. Thus, the body effect does not appear and the breakdown voltage is not reduced in a DC mode.

However, since the voltage of the body is inverted to the voltage of the source in an AC mode, the body effect appears and the gain also increases.

According to the common gate differential amplifier using body-source cross coupling of the present invention, it is possible to increase a gain and alleviate breakdown voltage reduction due to body effect, compared with the conventional differential amplifier. Since actual breakdown voltage drop is serious in the DC mode but an AC breakdown voltage is higher than a DC breakdown voltage, a problem due to the breakdown voltage drop is relatively reduced.

Figure 9:
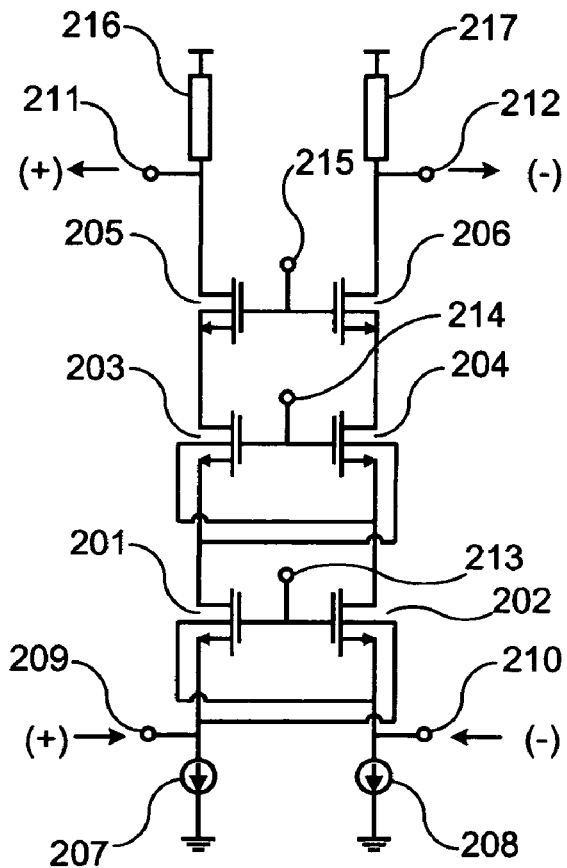
FIG. 9 is a circuit diagram showing a combination of at least one common gate differential amplifier using body-source cross coupling according to the present invention and a conventional common gate differential amplifier, which are connected in cascade.

Under one voltage source, at least one differential amplifier using body-source cross coupling according to the present invention may be combined with a common gate differential amplifier in cascade in plural stages, as shown in FIG. 9.

Figure 10:
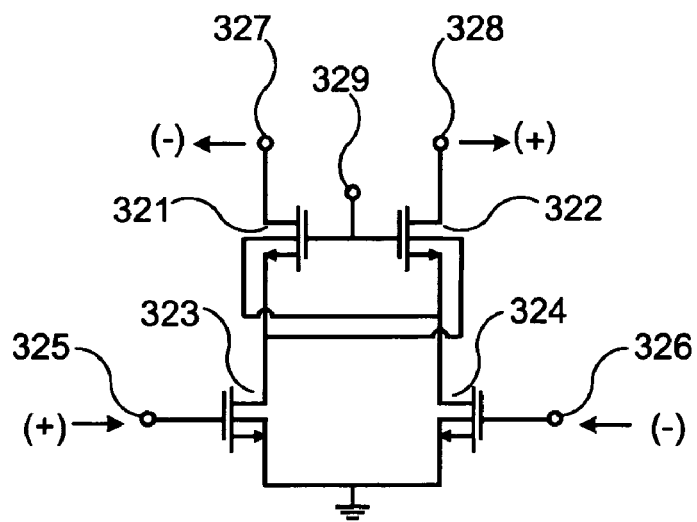
FIG. 10 is a circuit diagram showing a cascode differential amplifier using body-source cross coupling according to the present invention.

FIG. 10 is a circuit diagram showing a cascode differential amplifier using body-source cross coupling, in which NMOSFETs are used.

As shown, in the cascode differential amplifier in which common source differential amplifiers 323 and 324 and common gate differential amplifiers 321 and 322 are connected in cascade, the bodies and sources of the MOSFETs which configure the common gate differential amplifiers 321 and 322 are cross coupled to each other.

In the differential amplifier using body-source cross coupling, DC voltages are applied to gates 325 and 326 of common source differential amplifiers 323 and 324 and a common gate 329 of the common gate differential amplifiers 321 and 322 so as to form a bias circuit. The common gate 329 of the common gate differential amplifiers 321 and 322 is differentially operated in a virtual ground state.

Figure 1:
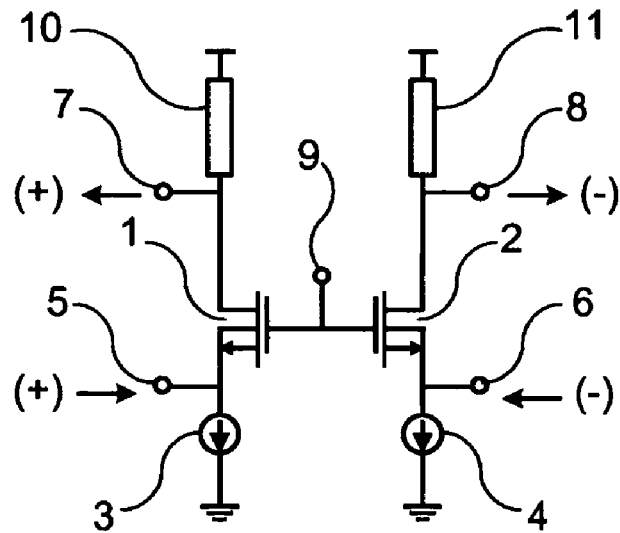
FIG. 1 is a circuit diagram showing a conventional common gate differential amplifier using NMOSFETs.
Figure 2:
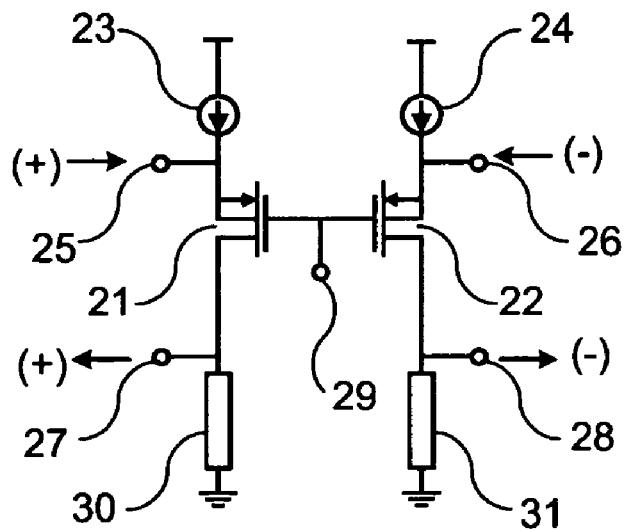
FIG. 2 is a circuit diagram showing a conventional common gate differential amplifier using PMOSFETs.
Figure 3:
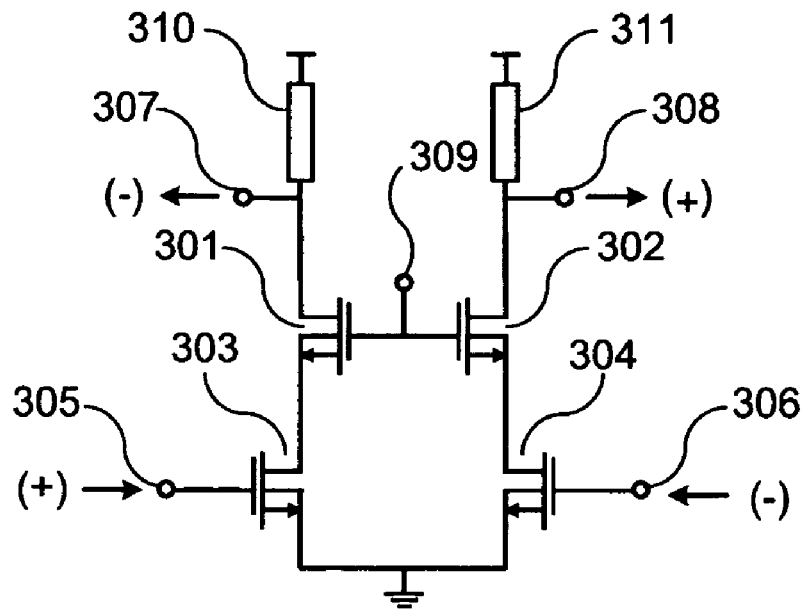
FIG. 3 is a circuit diagram showing a conventional cascode differential amplifier.

Drain terminals 327 and 328 of the common gate differential amplifiers 321 and 322 are provided with loads 310 and 311, as shown in FIG. 3.

Accordingly, differential signals are input to the gates 325 and 326, which are differential input terminals, and amplified differential signals are output from the drains 327 and 328, which are differential output terminals.

Figure 11:
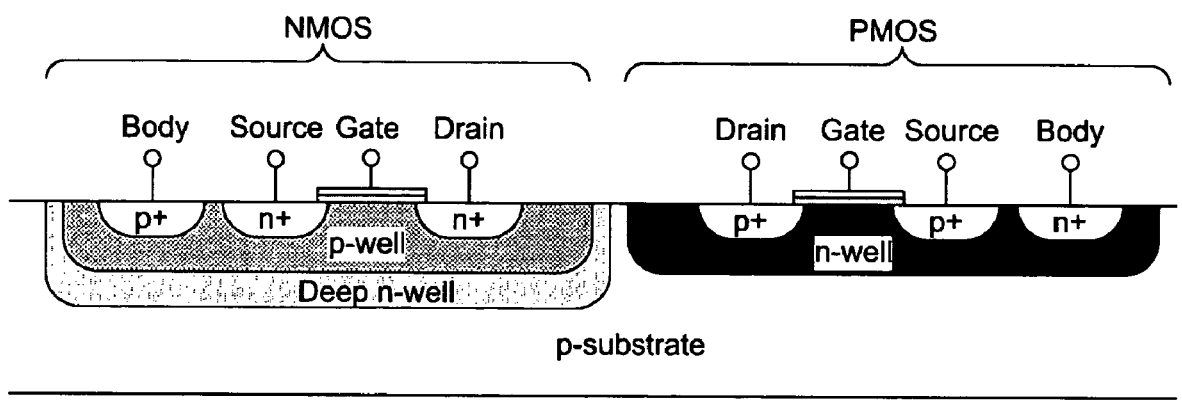
FIG. 11 is a cross-sectional view showing a MOSFET using a triple well process.

At this time, when the MOSFETs are the NMOSFETs, the bodies of the MOSFETs 321 and 322 of the common gate differential amplifier are formed by the triple well process shown in FIG. 11, and, when the MOSFETs are the PMOSFETs, the bodies of MOSFETs 321 and 322 are formed by the twin well process or the triple well process such that the bodies are electrically separated.

That is, in the common gate differential amplifier using body-source cross coupling, the potential of each body is equal to that of each source in a DC mode. However, in an AC mode, a potential difference occurs, because a signal having a phase opposite to that of a signal input to the source is input to the body. At this time, in order to perform a normal operation, a PN junction diode between the body and the source shown in FIG. 11 should not be turned on. Accordingly, an AC signal is normally operated in a voltage range of a small signal region in which the PN junction diode between the body and the source is not turned on.

Since the voltage of the body is inverted to the voltage of the source in the AC mode, the body effect appears and the gain also increases. As a result, the gain of the cascode differential amplifier is improved.

Figure 12:
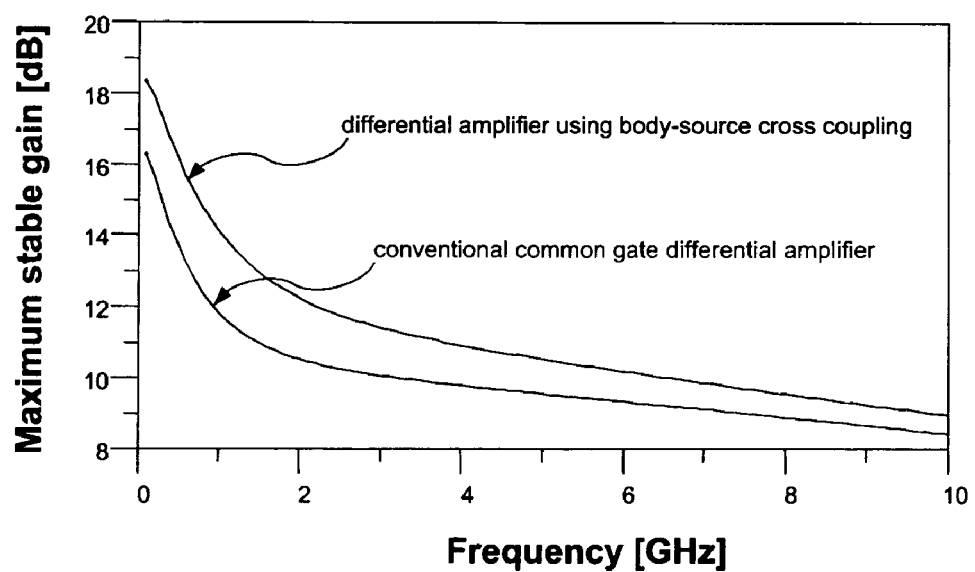
FIG. 12 is a graph showing a comparison in a maximum stable gain between the common gate differential amplifier using body-source cross coupling according to the present invention and the conventional common gate differential amplifier in accordance with a frequency, in a high current condition.

FIG. 12 is a graph showing a comparison in a maximum stable gain between the common gate differential amplifier using body-source cross coupling according to the present invention and the conventional common gate differential amplifier in accordance with a frequency.

As shown in FIG. 12, when the amplifier has a high current condition for obtaining a maximum gain, it can be seen that the maximum stable gain of the common gate differential amplifier using body-source cross coupling according to the present invention is higher than that of the conventional common gate differential amplifier by 1 to 2 dB in the entire frequency range.

Figure 13:
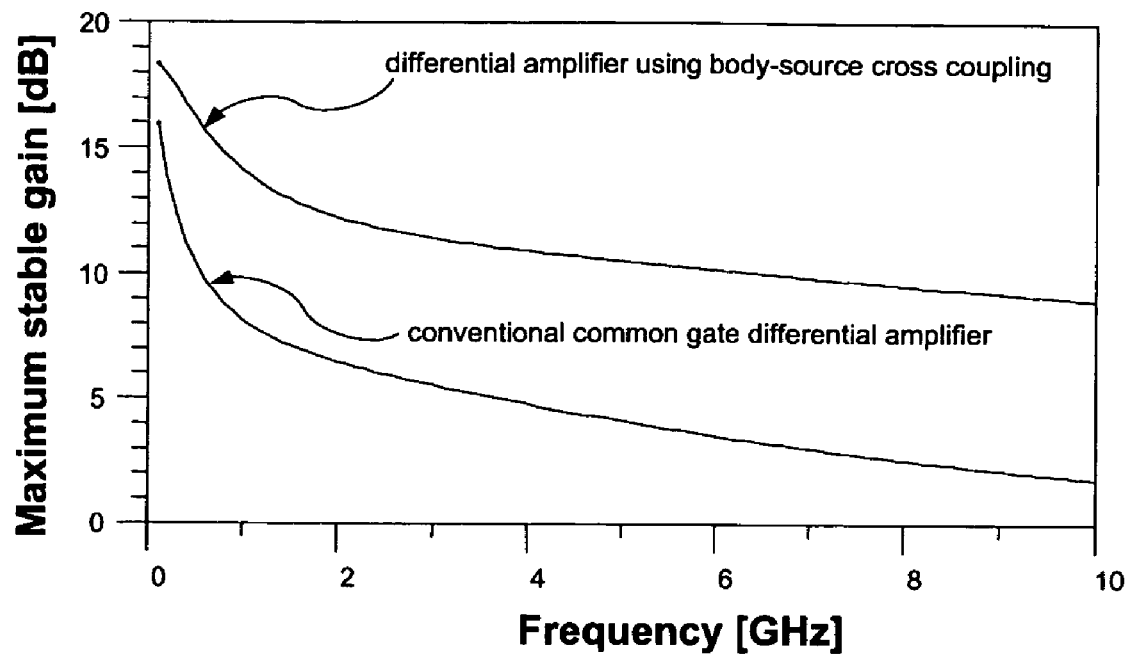
FIG. 13 is a graph showing a comparison in a maximum stable gain between the common gate differential amplifier using body-source cross coupling according to the present invention and the conventional common gate differential amplifier in accordance with a frequency, in a low current condition.

FIG. 13 is a graph showing a comparison in a maximum stable gain between the common gate differential amplifier using body-source cross coupling according to the present invention and the conventional common gate differential amplifier in accordance with a frequency.

As shown in FIG. 13, when the amplifier has a low current condition for obtaining a low gain, it can be seen that the maximum stable gain of the common gate differential amplifier using body-source cross coupling according to the present invention is higher than that of the conventional common gate differential amplifier by 2 to 7 dB in the entire frequency range.

The gain of the conventional amplifier is significantly reduced in the low current condition rather than in the high current condition. However, in the amplifier according to the present invention, the gain due to the body effect is improved even in the low current condition and thus the gain reduction decreases.

Figure 14:
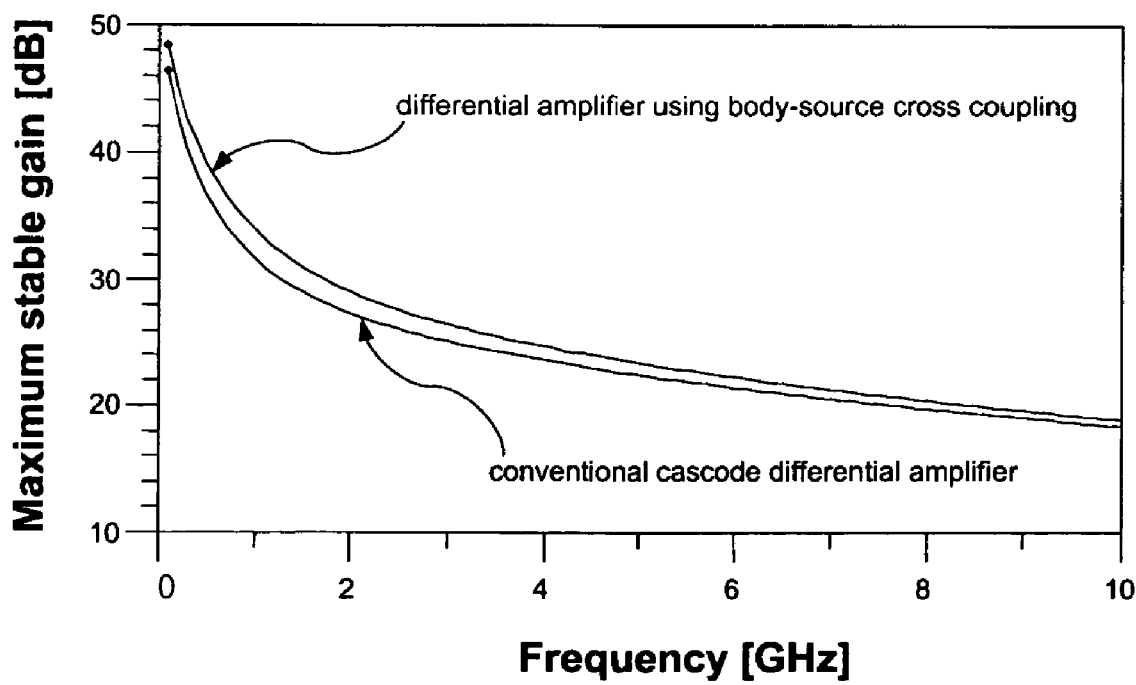
FIG. 14 is a graph showing a comparison in a maximum stable gain between the cascode differential amplifier using body-source cross coupling according to the present invention and the conventional cascode differential amplifier in accordance with a frequency, in a high current condition.

FIG. 14 is a graph showing a comparison in a maximum stable gain between the cascode differential amplifier using body-source cross coupling according to the present invention and the conventional cascode differential amplifier in accordance with a frequency.

As shown in FIG. 14, when the amplifier has a high current condition for obtaining a maximum gain, it can be seen that the maximum stable gain of the cascode differential amplifier using body-source cross coupling according to the present invention is higher than that of the conventional cascode differential amplifier by 1 to 2 dB in the entire frequency range.

Figure 15:
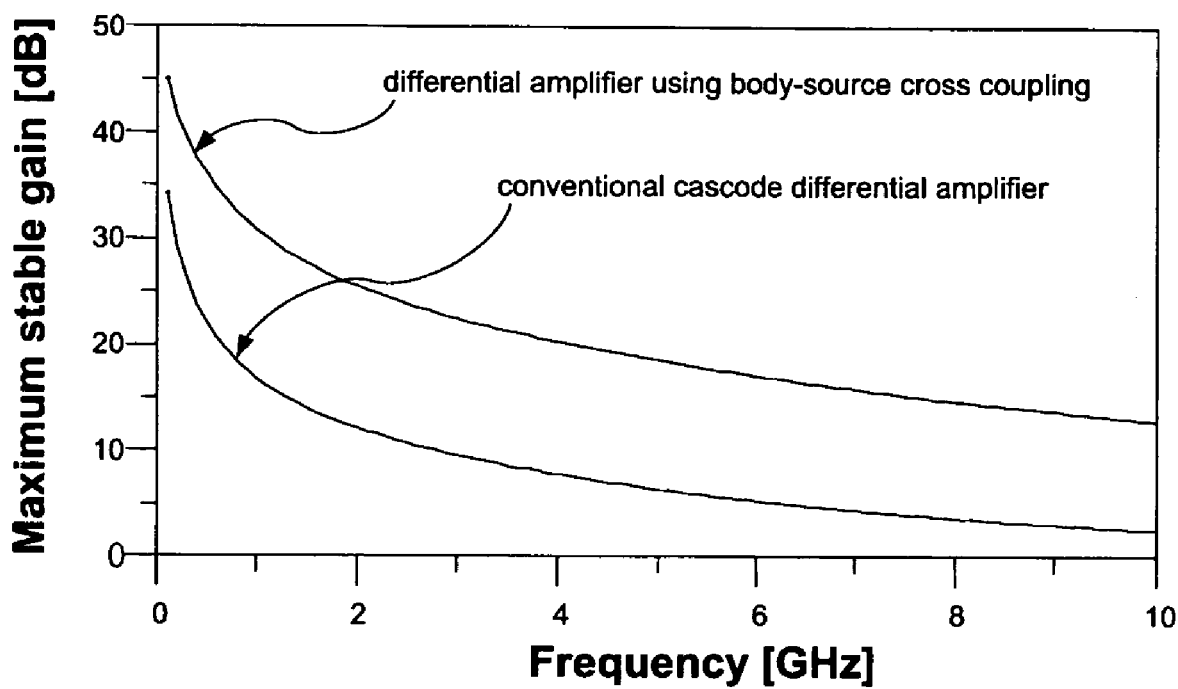
FIG. 15 is a graph showing a comparison in a maximum stable gain between the cascode differential amplifier using body-source cross coupling according to the present invention and the conventional cascode differential amplifier in accordance with a frequency in a low current condition.

FIG. 15 is a graph showing a comparison in a maximum stable gain between the cascode differential amplifier using body-source cross coupling according to the present invention and the conventional cascode differential amplifier in accordance with a frequency.

As shown in FIG. 15, when the amplifier has a low current condition for obtaining a low gain, it can be seen that the maximum stable gain of the cascode differential amplifier using body-source cross coupling according to the present invention is higher than that of the conventional cascode differential amplifier by 10 to 14 dB in the entire frequency range.

The gain of the conventional amplifier is significantly reduced in the low current condition rather than in the high current condition. However, in the amplifier according to the present invention, the gain due to the body effect is improved even in the low current condition and thus the gain reduction decreases.

As described above, in the differential amplifiers using body-source cross coupling according to the present invention, the gain is significantly improved in the low current condition and the small signal operation condition. Accordingly, the gain is significantly improved in a low-power analog circuit or a low-power RF circuit.

The breakdown voltage drop due to the body effect appears in the AC mode, not in the DC mode. Thus, the breakdown voltage drop is reduced.

As described above, according to the present invention, it is possible to increase transconductance due to body effect and to improve a gain by body-source cross coupling which means the bodies of common gate amplifiers of differential amplifiers are cross coupled to the sources of the opposite common gate amplifiers. Since the potential of the body is equal to that of the source in a DC mode, a breakdown voltage reduction problem is alleviated.

In the present invention, the gain is more improved than the conventional common gate differential amplifier in a low current operation condition as well as in a high current operation condition. Accordingly, when the present invention is applicable to a low-power analog circuit and a low-power RF circuit, a gain is significantly improved.

Although the preferred embodiments of the present invention have been disclosed, those skilled in the art will appreciate that various modifications, additions and substitutions are possible, without departing from the scope and spirit of the invention as disclosed in the accompanying claims.

The invention claimed is:

1. A differential amplifier using body-source cross coupling, in which the differential amplifier is comprised of common gate amplifiers in a differential structure, wherein the bodies of the common gate amplifiers are cross coupled to the sources of the opposite common gate amplifiers, and wherein both sources are used as differential input terminals and both drains are used as differential output terminals.

2. The differential amplifier according to claim 1, wherein at least one differential amplifier using body-source cross coupling is combined with one or more common gate differential amplifiers in cascade in plural stages under one voltage source.

3. The differential amplifier according to claim 1, wherein NMOSFETs for configuring the differential amplifier are formed in a triple well structure and PMOSFETS are formed in a twin well structure or the triple well structure.

4. A cascode differential amplifier using body-source cross coupling, in which the cascode differential amplifier is comprised of common source amplifiers and common gate amplifiers in differential structures, wherein the bodies of the common gate amplifiers are cross coupled to the sources of the opposite common gate amplifiers, and wherein both sources are used as differential input and both drains are used as differential output terminals.

5. The differential amplifier according to claim 4, wherein one cascode differential amplifier using body-source cross coupling is inserted under one voltage source and at least one common gate differential amplifier is inserted between the cascode differential amplifier and a load in cascade in plural stages.

6. The differential amplifier according to claim 4, wherein NMOSFETs for configuring the differential amplifier are formed in a triple well structure and PMOSFETS are formed in a twin well structure or the triple well structure.

7. The differential amplifier according to 2, wherein NMOSFETs for configuring the differential amplifier are formed in a triple well structure and PMOSFETS are formed in a twin well structure or the triple well structure.

8. The differential amplifier according to claim 5, wherein NMOSFETs for configuring the differential amplifier are formed in a triple well structure and PMOSFETS are formed in a twin well structure or the triple well structure.

9. A differential amplifier using body-source cross coupling, in which the differential amplifier is comprised of common gate amplifiers in a differential structure, wherein, the bodies of the common gate amplifiers are cross coupled to the sources of the opposite common gate amplifiers; and NMOSFETs for configuring the differential amplifier are formed in a triple well structure and PMOSFETS are formed in a twin well structure or the triple well structure.

* * * * *